US010205423B1

(12) United States Patent
Zanetta et al.

(10) Patent No.: US 10,205,423 B1
(45) Date of Patent: Feb. 12, 2019

(54) RAIL-TO-RAIL SOURCE FOLLOWER

(71) Applicant: NXP USA, Inc., Austin, TX (US)

(72) Inventors: Pedro B. Zanetta, Campinas (BR); Ricardo P. Coimbra, Campinas (BR)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 15/675,308

(22) Filed: Aug. 11, 2017

(51) Int. Cl.
*H03F 3/26* (2006.01)
*H03F 1/02* (2006.01)
*H03F 3/21* (2006.01)

(52) U.S. Cl.
CPC ............ *H03F 1/0205* (2013.01); *H03F 3/21* (2013.01); *H03F 2200/153* (2013.01); *H03F 2200/69* (2013.01)

(58) Field of Classification Search
CPC .................................. H03F 3/16; H03F 3/265
USPC .................................................. 330/264, 277
See application file for complete search history.

(56) References Cited

U.S. PATENT DOCUMENTS

| 5,646,576 | A | 7/1997 | Feldt et al. | |
|---|---|---|---|---|
| 7,208,974 | B1 | 4/2007 | Chui | |
| 7,304,538 | B2* | 12/2007 | Song | H03F 1/301 330/264 |
| 7,463,066 | B1 | 12/2008 | Chui | |
| 7,710,200 | B2 | 5/2010 | Cho et al. | |
| 7,764,123 | B2 | 7/2010 | Kimura | |
| 8,193,863 | B2* | 6/2012 | Tsurumi | H03F 3/3045 330/264 |
| 2004/0090272 | A1* | 5/2004 | Sibrai | H03F 3/3028 330/288 |
| 2005/0030681 | A1 | 2/2005 | Rosenthal | |
| 2008/0094126 | A1 | 4/2008 | Yamazaki | |
| 2015/0256135 | A1 | 9/2015 | Coimbra et al. | |

FOREIGN PATENT DOCUMENTS

EP        1458091 B1        1/2007

OTHER PUBLICATIONS

Suming Lai et al., An Improved Source Follower with Wide Swing and Low Output Impedance, IEEE Asia Pacific Conference on Circuits and Systems, Nov. 30-Dec. 3, 2008.
Patt Boonyaporn et al., A High Performance Class AB CMOS Rail to Rail Voltage Follower, 2002 IEEE Asia-Pacific Conference on ASIC Proceedings, Aug. 8, 2002, pp. 161-163.

* cited by examiner

*Primary Examiner* — Steven J Mottola

(57) ABSTRACT

A source follower method, system, and apparatus provide rail-to-rail capability to an output voltage terminal of a voltage follower feedback biased CMOS output circuit by providing a control circuit which includes first and second bypass transistors that are connected in parallel between first and second control circuit input/output terminals and controlled, respectively, by first and second control circuit inputs, and which also includes first and second current sources for injecting source and sink currents in the output node as a function, respectively, of a first bypass current through the first bypass transistor which turns ON when the output voltage rises above a top threshold voltage level and of a second bypass current through the second bypass transistor which turns ON when the output voltage falls below a bottom threshold voltage level.

20 Claims, 5 Drawing Sheets

-- PRIOR ART --

-- PRIOR ART --

US 10,205,423 B1

RAIL-TO-RAIL SOURCE FOLLOWER

BACKGROUND OF THE INVENTION

Field of the Invention

The present invention is directed in general to field of electronic circuits. In one aspect, the present invention relates generally to rail-to-rail follower circuits and associated methods of operation.

Description of the Related Art

A common-drain amplifier, also known as a "source follower," is a single-stage Field Effect Transistor (FET) amplifier topology commonly used in analog Integrated Circuit (IC) designs as voltage buffers and/or impedance transformers to transfer a voltage from a high impedance input node to a lower impedance output node, preferably while handling large output voltage swings and maintaining low harmonic distortion. When the voltage follower is driven by a voltage source having high output impedance, the output impedance of the combination is equal to the output impedance of the voltage follower only, which is relatively small. Examples of conventional current-source-loaded voltage follower circuits are depicted in FIG. 1 with reference to the N-type voltage follower 101 (FIG. 1(a)) and the P-type voltage follower 102 (FIG. 1(b)). In the depicted examples, a single current source (e.g., $I_{BIAS}$) drives a low impedance output $V_{OUT}$ in response to a voltage source having high input impedance $V_{IN}$ which controls a switching transistor (N1, P1) connected in series with the current source between supply rail voltages $V_{DD}$, $V_{SS}$. However, there are performance limitations with single-stage conventional source followers which support output excursion to only one of the supply rails. In particular, the N-type voltage follower amplifier 101 has a maximum output voltage $V_{OUT}$ that is limited to $V_{DD}-VG_{SN1}$. Similarly, the minimum output voltage for the P-type voltage follower amplifier 102 is $V_{SS}+V_{SGP1}$.

In order to improve the power efficiency of existing single stage source follower circuits, there have been source follower circuit arrangements proposed which seek to combine the performance benefits of separate single-stage source followers. For example, FIG. 2 illustrates a voltage follower (VF) feedback biased (FBB) class-AB CMOS output stage circuit 200 which effectively stacks an N-type voltage follower circuit and P-type voltage follower between the supply rail voltages $V_{DD}$, $V_{SS}$. At the input branch of the circuit 200, the input currents ($I_{IN1}$, $I_{IN2}$) are connected to drive the gates of diode-connected FETs (N2, P2) which are series-connected at a shared source node with corresponding input current sources (IIN1, IIN2) between the supply rail voltages $V_{DD}$, $V_{SS}$. The gates of the diode-connected FETs (N2, P2) are connected to the gates of the output branch FET transistors N1, P1 which are series-connected at a shared source/output node VOUT between the supply rail voltages $V_{DD}$, $V_{SS}$. Unfortunately, the VF FBB class-AB CMOS output stage circuit 200 does not support full rail-to-rail output excursion since the output voltage range (neglecting the voltage drops across the current sources IIN1, IIN2) is limited in both directions to $V_{DD}-V_{GS1}$ and $V_{SS}+V_{SG1}$. And while there are source follower designs which attempt to provide full rail-to-rail excursion, such solutions disadvantageously involve reducing bandwidth and/or otherwise degrading transient performance of the circuit. Thus, it can be seen from the foregoing, the existing solutions for rail-to-rail source follower circuit are extremely difficult at a practical level by virtue of the performance limitations and limited flexibility in correlating input and output branch behaviors, controlling operation to provide sufficient bandwidth without degrading transient performance, and handling uncorrelated sources of error.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
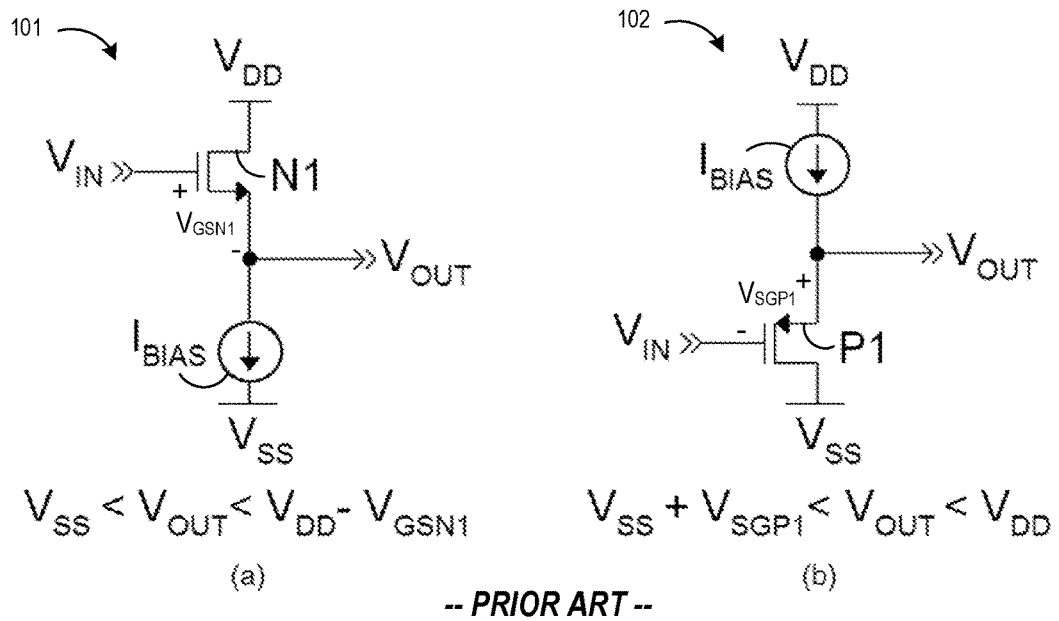
FIG. 1 shows simplified circuit diagrams of N-type and P-type single current-source-loaded voltage followers.
Figure 2:
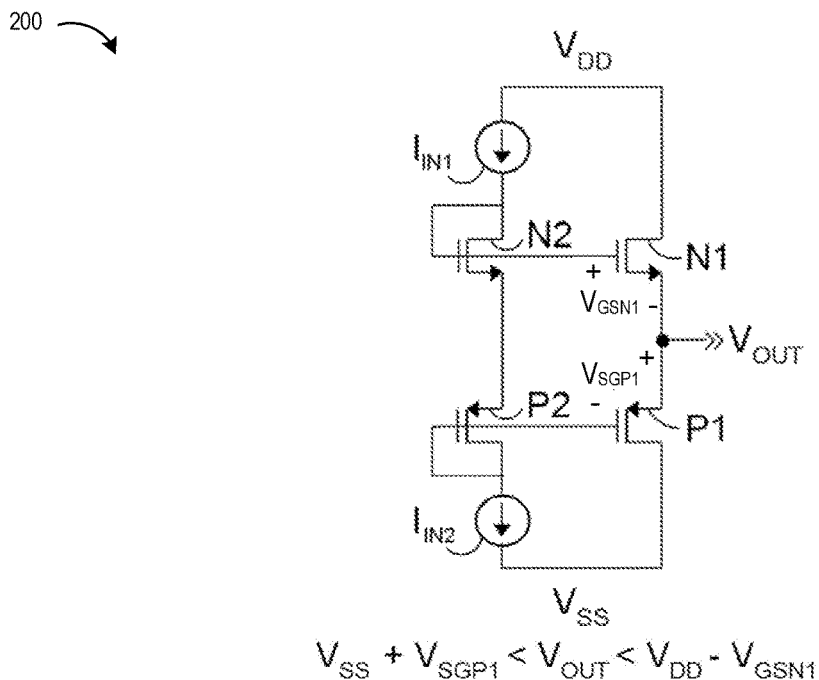
FIG. 2 shows a simplified circuit diagram of a voltage follower feedback biased class-AB CMOS output stage.

A system, apparatus, and methodology are described for providing rail-to-rail capability to common drain amplifiers with a source follower structure that automatically configures itself into a N-type, PN-type, or P-Type follower stage as best fit for the given output level by transitioning between different configurations in a smooth and well-controlled manner as the output level changes to maintain a stable output impedance over the whole output excursion range. In selected embodiments, the disclosed rail-to-rail follower circuit includes a control circuit addition for a voltage follower feedback biased class-AB CMOS output stage to provide the ability to set the desired voltage range and biasing currents for each configuration as best fit for the target application. With the disclosed control circuit addition, a source and sink currents that are injected in the output node are generated as a function of the current, respectively, through a first bypass transistor P3 (which turns-on when voltage rises above a design-defined top threshold) or through a second bypass transistor N3 (which turns-on when voltage falls below a design-defined bottom threshold). As a result, the rail-to-rail follower circuit can operate over three well-defined ranges (separated by two threshold levels), including a lower voltage range when the circuit will operate as an N-type follower stage when the associated bypass transistor N3 turns-on, an intermediate voltage range when the circuit will operate as a class-AB PN-type follower stage, and an upper voltage range when the circuit will operate as an P-type follower stage when the associated bypass transistor P3 turns-on. The circuit will operate as a class-AB PN-type follower stage on a mid-voltage range and only transition into P-type or N-type follower stage when the associated bypass transistor turns-on. In selected embodiments, the threshold levels defining the different stages may be conveniently placed as most appropriate for the application To provide a contextual understanding for selected embodiments of the present disclosure, reference is now made to the understanding of persons having ordinary skill in the art that a single stage amplifier structure, sometimes referred to as a "source follower" and/or "common-drain amplifier." is a basic circuit building block used extensively in analog Integrated Circuit (IC) design. Source followers are commonly found in various different applications and may be used, for example, as voltage buffers or to transform impedances. Generally speaking, a conventional source follower circuit only supports output excursions to one of the voltage supply rails, either the lower voltage rail if configured as an N-type source follower or to the upper voltage rail if configured as a P-type source follower. To address these and other shortcomings of conventional source follower circuits, Applicant has developed and disclosed novel source follower circuits that are configured to provide rail-to-rail capability with certain performance advantages that may be employed in a variety of applications, including but not limited to high performance Low-Dropout Regulators (LDOs) to drive a pass-device driver stage or as the output stage of amplifiers to thereby improve performance and/or reduce circuit footprint as compared to other approaches, such as hard-switching the gate of the pass-device to the rail.

Embodiments of rail-to-rail follower circuits described herein may automatically configure themselves as N-type source followers when their output levels pass a lower voltage threshold level and as P-type source followers when their output levels pass an upper voltage threshold level, while resembling PN-type followers when the output level is in the mid-voltage range between the lower and upper voltage threshold levels. As the output level varies, a rail-to-rail follower circuit may transition between its various configurations in a smooth and continuous manner while maintaining a stable output impedance over the excursion range. Therefore, these rail-to-rail follower circuits do not present the drawbacks related to switching techniques that show undesirable non-linear behavior around the switching region.

In addition, certain implementations may be based on a structure operating in current mode with no internal high-impedance nodes to achieve AC behavior equivalent to the basic follower stages. As such, these rail-to-rail follower circuits may provide the performance characteristics of a basic follower stage (e.g., AC bandwidth, transient behavior, etc.) while supporting rail-to-rail output excursion.

Figure 3:
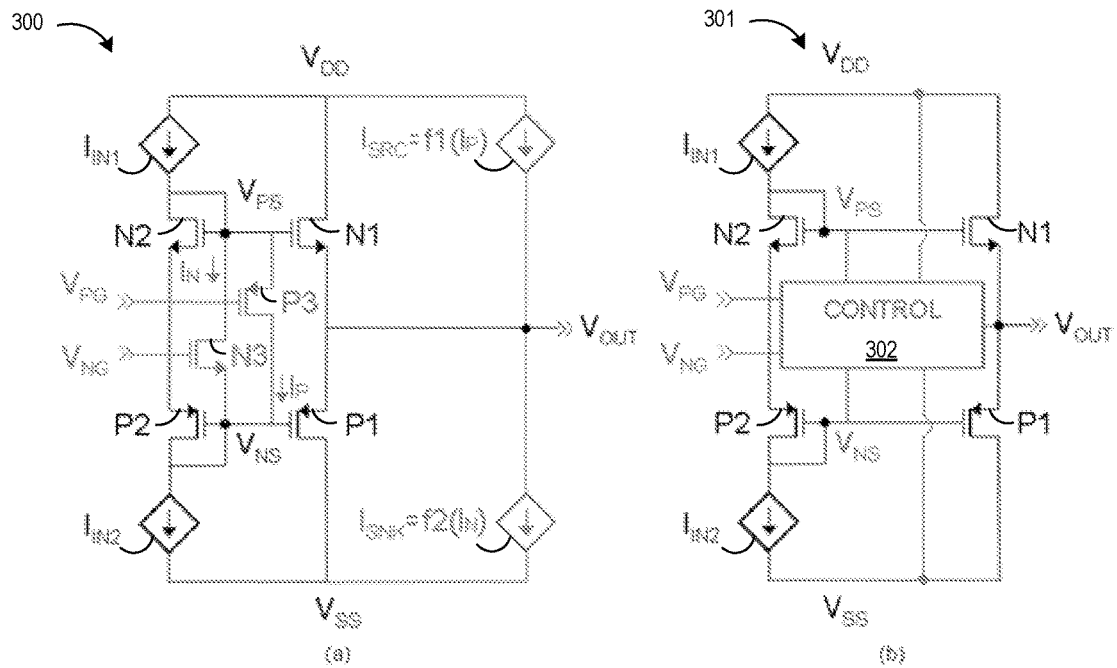
FIG. 3 shows simplified circuit diagrams of rail-to-rail follower circuit in accordance with selected embodiments of the present disclosure.

Turning now to FIG. 3a, there is depicted a simplified circuit diagram of a rail-to-rail follower circuit 300. Particularly, N-type metal-oxide-semiconductor (NMOS) transistor N1 has its drain terminal coupled to the $V_{DD}$ rail line, its source terminal coupled to the source terminal of P-type MOS (PMOS) transistor P1, and its gate terminal ($V_{PS}$) coupled between a drain terminal of a diode-connected NMOS transistor N2 and a first current supply $I_{IN1}$ that is connected to the $V_{DD}$ rail line. Also, PMOS transistor P1 has its drain terminal coupled to ground $V_{SS}$ or another suitable reference node, its source terminal coupled to the source terminal of the NMOS transistor N1 at the output of source follower 300 ($V_{OUT}$), and its gate terminal ($V_{NS}$) coupled between a drain terminal of a diode-connected PMOS transistor P2 and a second current supply $I_{IN2}$ that is connected to the ground/$V_{SS}$ rail line. The output of source follower 300, $V_{OUT}$, is provided at a node between the source terminals of N1 and P1. As will be understood, the output branch circuitry (N1, P1), input branch circuitry (N2, P2) and current supplies ($I_{IN1}$, $I_{IN2}$) represent the functional circuitry of a conventional VF FBB class-AB CMOS output stage which, by itself, does not support rail-to-rail operation.

In order to add support to rail-to-rail output excursion, the rail-to-rail follower circuit 300 also includes bypass transistors P3, N3 along with first and second current sources $I_{SRC}$ and $I_{SNK}$ connected and configured as shown such that the current provided to the source follower output $V_{OUT}$ is a function of the current conducted, respectively, by the bypass transistors P3, N3. In particular, the PMOS bypass transistor P3 has its drain terminal coupled to the gate terminal of the PMOS transistor P1, its source terminal coupled to the gate terminal of the NMOS transistor N1, and its gate terminal coupled to a first voltage level ($V_{PG}$) that sets an upper threshold voltage level. As will be appreciated, the value of the upper threshold of $V_{OUT}$—beyond which the circuit starts to configure itself as a P-Type follower—is not exactly $V_{PG}$. Instead, the upper threshold is reached when $V_{OUT}=V_{PG}+V_{GSon\_P3}-V_{GS\_N1}$, where $V_{GSon\_P3}$ represents the "turn-on" gate-source voltage of P3. Hence, the upper threshold is $V_{PG}$ shifted by ($V_{GSon\_P3}-V_{GS\_N1}$). The same holds true for the NMOS bypass transistor N3 which has its source terminal coupled to the gate terminal of the PMOS transistor P1, its drain terminal coupled to the gate terminal of the NMOS transistor N1, and its gate terminal coupled to a second voltage level ($V_{NG}$) that sets a lower threshold level. Finally, the first current source $I_{SRC}$ is coupled between the $V_{DD}$ rail line and the source follower output $V_{OUT}$, while the second current source $I_{SNK}$ is coupled between the source follower output $V_{OUT}$ and the $V_{SS}$ rail line, as shown.

In this configuration, the currents $I_{SRC}$ and $I_{SNK}$ and the bypass transistors N3 and P3 are controlled to configure the rail-to-rail follower circuit 300 as N-type, PN-type, or P-Type follower stage as best fit for the given input level by producing the current $I_{SRC}$ as a function of the current conducted by the bypass transistor P3, and producing the current $I_{SNK}$ as a function of the current conducted by the bypass transistor N3. For mid-range output levels, both the bypass transistors P3 and N3 are cut-off, causing $I_{SRC}=I_{SNK}=0$. The circuit then resembles the conventional class-AB PN-type follower stage. However, as the source follower output voltage $V_{OUT}$ moves past the upper voltage threshold level set by $V_{PG}$ and toward $V_{DD}$, the bypass transistor P3 will eventually start to conduct current, thereby bypassing transistors N2 and P2. Simultaneously, the current source $I_{SRC}$, being a function of the current ($I_P$) conducted by the bypass transistor P3, will also start to rise. As the source follower output $V_{OUT}$ reaches a level closer to $V_{DD}$, the bypass transistor P3 completely bypasses N2 and P2, conducting all current in the output branch circuitry N1, P1 (N2 and P2 are cut-off), at which point the current source $I_{SRC}$ reaches its final value. The circuit now resembles the conventional P-type source follower shown in FIG. 1(b). As will be appreciated, the source follower output $V_{OUT}$ does not necessarily need to be very near $V_{DD}$. For example, a designer may choose to set a narrow range for PN-Type operation in between wider ranges for N-Type or P-Type operation. In other some scenarios, the bypass transistor P3 may be designed to not completely bypass the transistors N2 and P2, and the bypass transistor P2 may be designed to not completely bypass the transistors N1 and P1.

In the other direction with $V_{OUT}$ moving past the lower voltage threshold level set by $V_{NG}$ and toward the ground/$V_{SS}$ rail line, the bypass transistor N3 will eventually start to conduct, thereby bypassing transistors N2 and P2. Simultaneously, the current source $I_{SNK}$, being a function of the current ($I_N$) conducted by the bypass transistor N3, will also start to rise. As the source follower output $V_{OUT}$ reaches a level closer to $V_{SS}$, the bypass transistor N3 completely or at least partially bypasses, N2 and P2 to conduct current in the output branch circuit N1, P1 (e.g., N2 and P2 are cut-off), at which point the current source $I_{SNK}$ reaches its final value. The circuit now resembles the conventional N-type source follower shown in FIG. 1(a).

As will be appreciated, the depicted arrangement of the bypass transistors P3, N3 and current sources $I_{SRC}$ and $I_{SNK}$ provide an example embodiment of the additional circuitry that may be added to control the different configurations of the rail-to-rail follower circuit 300, but other embodiments of control circuitry can be used. To illustrate this, reference is now made to FIG. 3b which depicts a simplified circuit diagram of a rail-to-rail source follower circuit 301 in which a control circuit block 302 is added to a class-AB PN-type follower stage having an input branch circuitry (N2, P2), current supplies ($I_{IN1}$, $I_{IN2}$), and output branch circuitry (N1, P1) connected as shown. With this block diagram representation of the control circuit block 302, it will be appreciated that the current driven to or sunk from output $V_{OUT}$ may be generated as a function of the current flowing through the bypass transistors through any desired circuit configuration so that there are smooth transitions between the different N-type, P-type, and PN-type follower configurations. With $I_{SNK}$ and $I_{SRC}$ being produced through separate functions of the N3 and P3 currents, respectively, there is large flexibility to define by design the most appropriate transition thresholds, current outputs, and behavior for the alternative configurations.

In operation, the control circuit block 302 is connected to the supply rail voltages $V_{DD}$, $V_{SS}$ and is configured to convey an output voltage $V_{OUT}$ across the full range of the supply rail voltages $V_{DD}$, $V_{SS}$ by using the received bias voltages ($V_{PG}$, $V_{NG}$) to configure the source follower circuit 301 as an N-type, PN-type, or P-Type follower stage, as best fit for the given output level $V_{OUT}$ in relation to the thresholds set through the bias voltages. When the output level $V_{OUT}$ is between the upper and lower threshold, the control circuit block 302 delivers zero current from the current source $I_{SRC}$, $I_{SNK}$ to bias the output branch transistors N1 and P1, respectively, obtaining an IQ quiescent current and thus resulting in PN-type follower configuration. However, as the output level $V_{OUT}$ rises above ($V_{PG}+V_{SGP3\_ON}-V_{GSN1}$), where $V_{SGP3\_ON}$ is the P3's source-gate voltage beyond which P3 is considered to be conducting (turned on), the control circuit block 302 sources an increasing current source $I_{SRC}$ up to the maximum $I_{LIM\_RC}$ value. From around that point forward, the control circuit block 302 cuts off the NMOS transistor N1, and thus resulting in a P-type follower configuration. As will be appreciated, the control circuit block 302 can be used to control the output impedance as appropriate while maintaining smooth variations smooth, where the controlled output impedance may be reduced, unchanged, or even increased as $V_{OUT}$ drifts into any direction. In addition, the current limit values, $I_{LIM\_SRC}$ and $I_{LIM\_SNK}$, can be different. Conversely, as the output level $V_{OUT}$ falls below ($V_{NG}-V_{GSN3\_ON}+V_{SGP1}$), where $V_{GSN3\_ON}$ is N3's gate-source voltage beyond which N3 is considered to be conducting (turned-on), the control circuit block 302 drains an increasing current source $I_{SNK}$ up to the maximum $I_{LIM\_SNK}$ value. From that point forward, the control circuit block 302 is allowed to saturate the cutting-off transistor P1, thus resulting in an N-type follower configuration. Current limits $I_{LM\_SNK}$ and $I_{LIM\_SRC}$ are chosen to set output impedance levels for P-Type and N-Type configurations, respectively, as best fit to the application. In some embodiments, the output impedances of the P-type, N-type, and PN-type configurations are made as close as possible to maintain a stable and near constant output impedance across the entire output range. As the circuit transitions between N-type, PN-type, and P-type configurations, variations in output impedance are smooth and well-behaved.

In selected embodiments, by matching the transconductance of the output branch FET transistors N1, P1, the output impedance of source follower circuit 301 is matched for all of three circuit configurations with a continuous and smooth profile in the transition regions. To this end, the gain of the control circuit block 302 and the upper and lower threshold defined by the bias voltages $V_{PG}$ and $V_{NG}$ may be adjusted to best fit the transition profiles within a given range of output voltage excursion. And in selected embodiments, the midpoint between the upper and lower threshold may be equal to a halfway point between the upper and lower supply rail voltages $V_{DD}$, $V_{SS}$. In this way, the source follower circuit 301 injects current in the output node $V_{OUT}$ as a function of the current flowing through bypass transistor P3 (which turns-on when voltage rises above a design-defined top threshold) or through bypass transistor N3 (which turns-on when voltage falls below a design-defined bottom threshold), thereby setting three well defined ranges (separated by two threshold levels). Advantageously, the source follower circuit 301 may be designed to operate as a class-AB PN-type follower stage on a wider voltage range and only transition into P-type or N-type follower stage when the associated bypass transistor turns on. Such thresholds may be conveniently placed by setting the thresholds defined by bias voltages $V_{PG}$ and $V_{NG}$ as most appropriate for the application.

Figure 4:
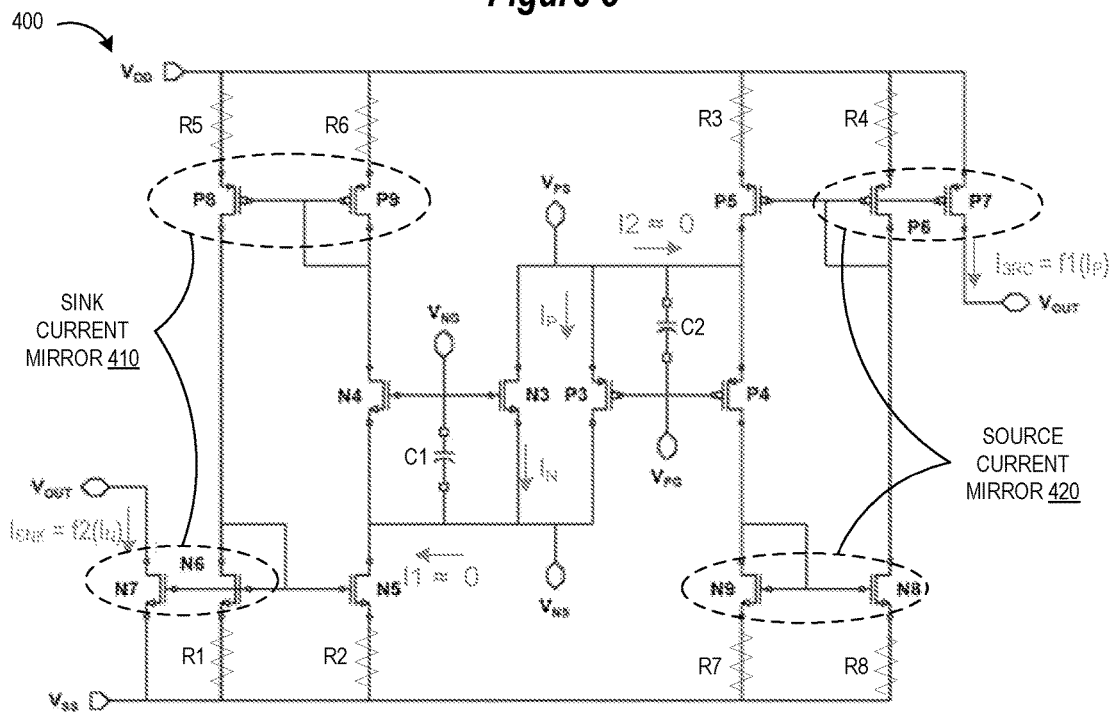
FIG. 4 shows a circuit diagram of a control block circuit in accordance with selected embodiments of the present disclosure.

Turning now to FIG. 4, there is shown a circuit diagram of a control block circuit 400 which may be a possible implementation of the control circuit block 302 in accordance with selected embodiments of the present disclosure. In the disclosed embodiments of the control block circuit 400, a closed-loop structure is used to generate an amplified copy of the current that flows through each bypass transistor P3 and N3. As disclosed, the control block circuit 400 includes bypass transistors P3, N3 along with first current source $I_{SNK}$ 410 and second current source $I_{SRC}$ 420 connected and configured as shown such that the current provided to the source follower output $V_{OUT}$ is a function of the current conducted, respectively, by the bypass transistors P3, N3. Note that the input current of each closed-loop structure can be reduced or substantially eliminated (e.g., I1, I2≈0) in order to create negligible effect on the input branch current.

In particular and as illustrated in FIG. 4, the control block circuit 400 may include bypass transistors P3, N3 connected in a parallel between the PMOS source node ($V_{PS}$) and the NMOS source node ($V_{NS}$) terminals and controlled at their respective gate terminals by the biasing voltages $V_{PG}$ and $V_{NG}$. The depicted control block circuit 400 also includes a sink current mirror 410 for selectively driving a first current ($I_{SNK}$=f2($I_N$)) that is an amplified copy of the current ($I_N$) conducted by the bypass transistor N3, and a source current mirror 420 for selectively driving a second current ($I_{SRC}$=f1($I_P$)) that is an amplified copy of the current ($I_P$) conducted by the bypass transistor P3. In this configuration, the current that flows through the bypass transistor N3 is sensed via the NMOS transistor N4 by connecting their respective gate and source terminals together at shared nodes separated by a first capacitor C1 (which may optionally be included to improve high-frequency behavior of the circuit). With the sink current mirror 410 including the PMOS transistors P8, P9 and NMOS transistors N6 and N7 connected as shown, the sink current mirror 410 is used to sink a current at the output node $V_{OUT}$ that is proportional to the drain current of NMOS transistor N3. To prevent the extra current from the NMOS transistor N4 from disturbing the operating condition of the circuit connected to the control block, the NMOS transistor N5 may be added to collect the current from the NMOS N4 (i.e., I1≈0).

In similar fashion, the source current mirror 420 has current flow through the bypass transistor P3 that is sensed via the PMOS transistor P4 by connecting their respective gate and source terminals together at shared nodes separated by a second capacitor C2 (which may optionally be included to improve high-frequency behavior of the circuit). With the source current mirror 420 including the PMOS transistors P6, P7 and NMOS transistors N9 and N10 connected as shown, the source current mirror 420 is used to sink a current at the output node $V_{OUT}$ that is proportional to the drain current of PMOS transistor P3. To prevent the extra current from the PMOS transistor P4 from disturbing the operating condition of the circuit connected to the control block, the PMOS transistor P5 may be added to collect the current from the PMOS P4 (i.e., I2≈0).

In order to improve matching performance between the sink and source current mirrors 410, 420, selected embodiments of the present disclosure may employ source-degenerated current mirrors by adding appropriately sized resistor elements, shown in dashed lines as being optionally included impedance elements R1-R8 at the sources of the transistors N6, N5, P5, P6, P8, P9, N8, N9 respectively. Since the current sinked from the output node $V_{OUT}$ is limited by the gains of the P8-P9 and N6-N7 current mirror stages which form the current mirrors 410, the size and capacitance added by the NMOS transistor N7 may be reduced by making the N6-N7 current mirror asymmetric by inserting the resistors R1, R2 in series between the supply rail $V_{SS}$ and the source of the NMOS transistors N6 (and N5). Similarly, the source current mirror 420 may be modified by inserting the resistors R3, R4 in series between the supply rail $V_{DD}$ and the source of the PMOS transistors P5 (and P6). With these changes, the current sourced to the output node $V_{OUT}$ by the PMOS transistor P7 will be a non-linear function of the current ($I_P$) conducted by the bypass transistor P3.

Figure 5:
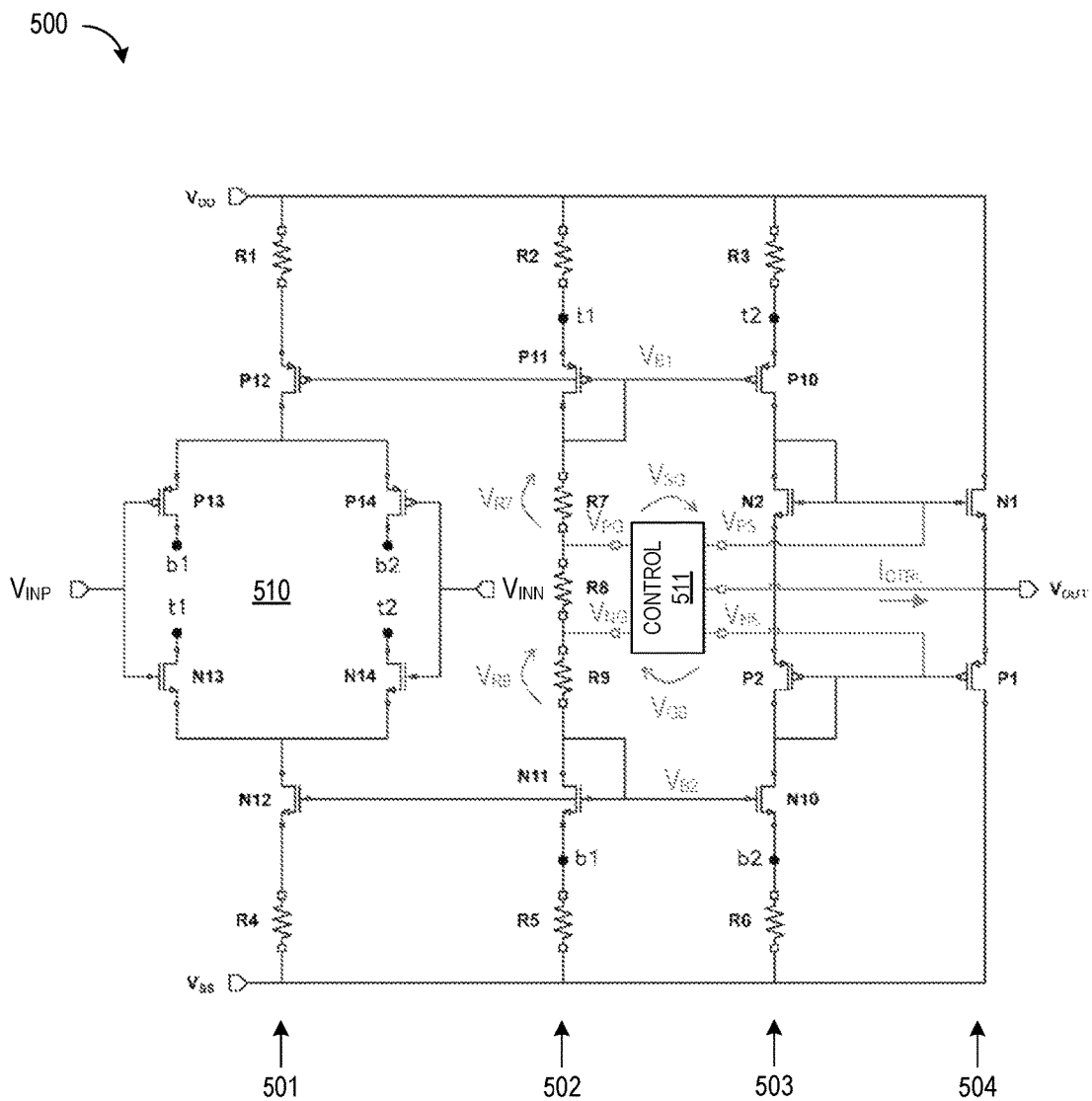
FIG. 5 shows a circuit diagram of an example application for a rail-to-rail follower circuit in accordance with selected embodiments of the present disclosure.

Turning now to FIG. 5, there is shown a circuit diagram of an amplifier 500 wherein a rail-to-rail follower circuit is used to extend the output voltage range. In the disclosed embodiments, the depicted amplifier 500 includes a plurality of branches 501-504 connected in parallel between the supply rails $V_{DD}$, $V_{SS}$. A first voltage input branch 501 includes NMOS transistors N12, N13, N14 and PMOS transistors P12, P13, P14 configured and connected as an input stage 510 across the resistors R1, R4 to the supply rails $V_{DD}$, $V_{SS}$. In the first voltage input branch 501, the input stage voltages $V_{INP}$, $V_{INN}$ are connected at gate terminals of PMOS transistors P13 and P14 that have source terminals connected to the drain of the PMOS transistor P12 and are also connected at gate terminals of NMOS transistors N13 and N14 that have source terminals connected to the drain of the NMOS transistor N12.

A second or middle branch 502 includes an upper resistor R2, diode-connected PMOS transistor P11, middle resistor string R7, R8, R9, diode-connected NMOS transistor N11, and lower resistor R5 configured and connected in series as shown between the supply rails $V_{DD}$, $V_{SS}$. In the second voltage input branch 502, there is formed a top terminal t1 (between the upper resistor R2 and the source of the diode-connected PMOS transistor P11), a first biasing voltage terminal $V_{PG}$ (between the resistors R7, R8), a second biasing voltage terminal $V_{NG}$ (between the resistors R8, R9), and a bottom terminal b1 (between the source of the diode-connected NMOS transistor N11 and the lower resistor R5. Terminal t1 is connected to drain terminal of input branch 510 transistor N13. Terminal b1 is connected to drain terminal of input branch 510 transistors P13. In addition, the gate terminals of the diode-connected PMOS transistor P11 and diode-connected NMOS transistor N11 are connected, respectively, to the gate terminals of the PMOS transistor P12 and NMOS transistor N12.

A third or source follower input branch 503 includes an upper resistor R3, top PMOS transistor P10, diode-connected NMOS transistor N2, diode-connected PMOS transistor P2, bottom NMOS transistor N10, and lower resistor R6 configured and connected in series as shown between the supply rails $V_{DD}$, $V_{SS}$. In the third voltage input branch 503, there is formed a top terminal t2 (between the upper resistor R3 and the source of the PMOS transistor P10), a first voltage terminal $V_{PS}$ (between the drain of the PMOS transistor P10 and the gate/drain of the diode-connected NMOS transistor N2), a second voltage terminal $V_{NS}$ (between the drain of the NMOS transistor N10 and the gate/drain of the diode-connected PMOS transistor P2), and a bottom terminal b2 (between the source of the NMOS transistor N10 and the lower resistor R6. Terminal t2 is connected to drain terminal of input branch 510 transistor N14. Terminal b2 is connected to drain terminal of input branch 510 transistors P14. In addition, the gate terminals of the PMOS transistor P10 and NMOS transistor N10 are also connected, respectively, to the gate terminals of the PMOS transistor P12 and NMOS transistor N12.

A fourth or source follower output branch 504 includes a top NMOS transistor N1 and bottom PMOS transistor P1 configured and connected in series as shown between the supply rails $V_{DD}$, $V_{SS}$. In the fourth voltage input branch 504, the output terminal $V_{OUT}$ is formed at the shared source node of the transistors N1, P1. In addition, the gate terminals of the NMOS and PMOS transistors N1, P1 connected, respectively, to the gate terminals of the diode-connected NMOS transistor N2 and diode-connected PMOS transistor P2.

In addition, a control circuit block 511 is connected to the fourth branch 504 to generate the output current $I_{CTRL}$ at the output terminal $V_{OUT}$. Thought not shown, the control circuit block 511 may be connected to the supply rail voltages $V_{DD}$, $V_{SS}$. In addition, the biasing voltages $V_{PG}$ and $V_{NG}$ are generated from internal nodes in the second branch 502 so as to not increase the overall current consumption. In addition, the first voltage $V_{PS}$ at the drain terminal of the PMOS transistor P10 is therefore $V_{B1} - V_{R7} + V_{SG}$. In order to keep the PMOS transistor P10 saturated, the resistor R7 and PMOS transistor P3 inside the control circuit block 511 are designed such that $V_{PS} < V_{B1} + |V_{THp}|$. In other words, $V_{PS} = V_{B1} - V_{R7} + V_{SG} < V_{B1} + |V_{THp}|$. A similar approach for sizing the resistor R9 and NMOS transistor N3 inside the control circuit block 511 to keep the NMOS transistor N10 operating in the saturation region, such that $V_{NS} = V_{B2} + V_{R9} - V_{GS} > V_{B2} - V_{THn}$.

Figure 6:
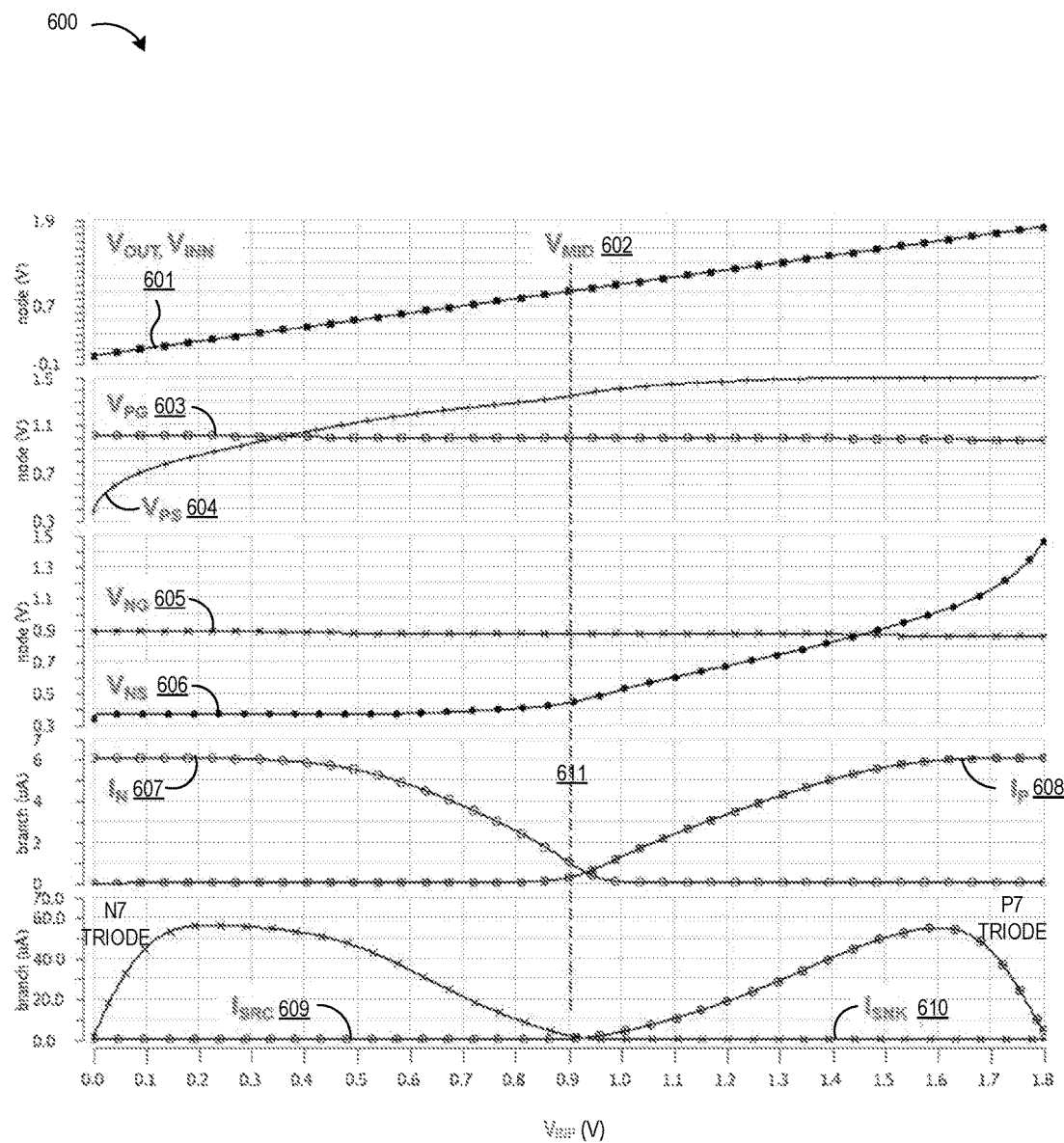
FIG. 6 shows waveforms from a DC sweep simulation to illustrate operation of the circuit diagram of FIG. 5 connected as a unity-gain amplifier (buffer) which embeds a rail-to-rail follower circuit in accordance with selected embodiments of the present disclosure.

To provide additional details for an improved understanding of selected embodiments of the present disclosure, reference is now made to FIG. 6 which shows waveforms 600 from a DC sweep simulation of the amplifier 500 from FIG. 5 which includes the control block circuit 400 from FIG. 4 and which is configured as a unity gain amplifier by connecting the $V_D$ terminal to the output terminal $V_{OUT}$. In particular, the control block circuit 400 includes series resistance elements R1-R4 added in series with the source terminals of N5, N6, P5 and P6, respectively, so that the sink current output $I_{SNK}$ is a non-linear function of the current ($I_N$) conducted by the bypass transistor N3 and so that the source current output $I_{SRC}$ is a non-linear function of the current ($I_P$) conducted by the bypass transistor P3.

In this example and as shown in curve 601, $V_{INN}$ and $V_{OUT}$ (which are connected together) vary from the lower rail voltage $V_{SS}$ (e.g., 0 V) to the upper rail voltage $V_{DD}$ (e.g., 1.8 V), thereby crossing the voltage midpoint $V_{MID}$ 602. As the input voltage $V_{INP}$ applied at the input stage 501 is reduced from $V_{MID}$ to $V_{SS}$ (0V), the first voltage terminal $V_{PS}$ (curve 604) eventually drops below the upper threshold voltage level defined by $V_{PG}$ (curve 603) and the current ($I_N$) in the second bypass transistor N3 (curve 607) becomes the current that would otherwise flow through the diode-connected NMOS transistor N2, thereby clamping the second voltage terminal $V_{NS} \approx 0.35V$ (curve 606). In this control implementation, the sink current output $I_{SNK}$ (curve 610) is a non-linear function of the current ($I_N$) (curve 607). The current mirror's NMOS transistor N7 eventually leaves saturation (enters triode region) when the output voltage becomes very low which is the reason why the sink current output $I_{SNK}$ (curve 610) starts to reduce at $V_{INP}$ below 0.15V.

In particular, as the input voltage $V_{IP}$ increases from $V_{MID}$ to $V_{DD}$ (1.8V), the second voltage terminal $V_{NS}$ (curve 606) eventually increases above the lower threshold voltage level defined by $V_{NG}$ (curve 605) and the current ($I_P$) in the first bypass transistor P3 (curve 608) becomes the current that would otherwise flow through the diode-connected PMOS transistor P2, thereby clamping the first voltage terminal $V_{PS} \approx 1.5V$ (curve 604). In this control implementation, the source current output $I_{SRC}$ (curve 609) is a non-linear function of the current ($I_P$) (curve 608). The current mirror's PMOS transistor P7 eventually leaves saturation (enters triode region) when the output voltage becomes very high which is the reason why the source current output $I_{SRC}$ (curve 609) starts to reduce at $V_{INP}$ above 1.65V.

To understand the configurable follower stage operation of the amplifier 500, curves 607 and 608 define a central trough region 611 with reference to the current ($I_N$) through the second bypass transistor N3 (curve 607)—which dips from approximately 6.0 uA to approximately zero (to the right of the trough)—and the current ($I_P$) through the first bypass transistor P3 (curve 607)—which increases from approximately zero to approximately 6.0 uA (to the left of the trough) as a function of $V_{INP}$. With respect to curves 607 and 608, the circuit 500 operates as an N-type source follower (to the left of the trough), as a P-type source follower (to the right of the trough), and as a PN-type source follower (in the trough region).

Figure 7:
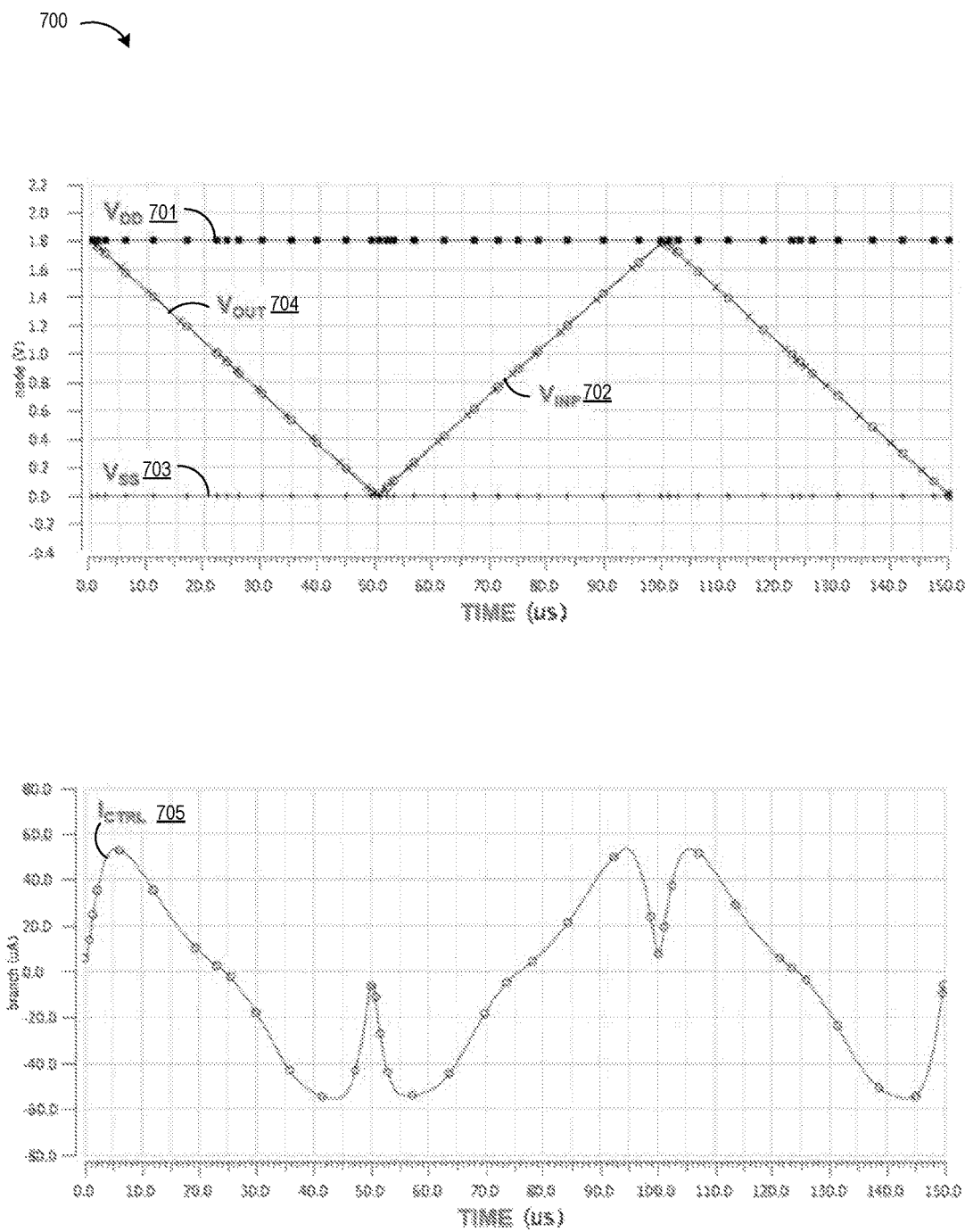
FIG. 7 shows waveforms from a transient simulation to illustrate operation of the circuit diagram of FIG. 5 connected as a unity-gain amplifier (buffer) which embeds a rail-to-rail follower circuit in accordance with selected embodiments of the present disclosure.

To provide additional details for an improved understanding of selected embodiments of the present disclosure, reference is now made to FIG. 7 which shows waveforms 700 from a transient simulation to illustrate operation of an amplifier circuit (e.g., 500). In this example, the input voltage $V_{INP}$ (curve 702) is varied from the lower rail voltage $V_{SS}$ (curve 703) to the upper rail voltage $V_{DD}$ (curve 701) in a triangular manner. In addition, the source follower output $V_{OUT}$ 704 is following the input voltage $V_{INP}$ (curve 702). Curve 705 shows the value of the output terminal current $I_{CTRL}$ generated by the control block circuit in response to the source and sink current outputs $I_{SRC}$, $I_{SNK}$, such that $I_{CTRL}=I_{SRC}-I_{SNK}$. As illustrated, the output terminal current $I_{CTRL}$ generally tracks rises and reductions in the input voltage $V_{INP}$ (curve 702) except when $V_{INP}$ gets so near the supply rails that the source or sink current source transistor goes into triode and then linear region, at which point, the output terminal current $I_{CTRL}$ spikes toward $I_{CTRL}=0$ uA as the input voltage VIP (curve 702) reaches the lower or upper rail voltages $V_{SS}$ 703, $V_{DD}$ 701. In particular, the output terminal current $I_{CTRL}$ waveform (curve 705) shows that, for mid-range levels of the output voltage $V_{OUT}$ 704, the bypass transistor P3, N3 are both cut-off, causing $I_{CTRL}=0$, at which point the circuit then resembles the conventional class-AB PN-type follower stage. However, as $V_{OUT}$ 704 moves toward $V_{DD}$ 701, the bypass transistor P3 begins bypassing transistors N2 and P2 so that the source current $I_{SRC}$ starts to rise, causing $I_{CTRL}$ to become equal to the source current $I_{SRC}$ so that the circuit now resembles the conventional P-type source follower. And as $V_{OUT}$ 704 moves toward $V_{SS}$ 703, the bypass transistor N3 begins bypassing transistors N2 and P2 so that the sink current $I_{SNK}$ starts to rise, causing $I_{CTRL}$ to become equal to the sink current $I_{SNK}$ so that the circuit now resembles the conventional N-type source follower.

In many implementations, the systems and methods disclosed herein may be incorporated into a wide range of electronic devices including, for example, computer systems or Information Technology products such as servers, desktops, laptops, memories, switches, routers, or the like; telecommunications hardware; consumer devices or appliances such as mobile phones, tablets, television sets, cameras, sound systems, or the like; scientific instrumentation; industrial robotics; medical or laboratory electronics such as imaging, diagnostic, or therapeutic equipment, or the like; transportation vehicles such as automobiles, buses, trucks, trains, watercraft, aircraft, or the like; military equipment, etc. More generally, these systems and methods may be incorporated into any device or system having one or more electronic parts or components. In addition, selected embodiments of the present disclosure may be embodied in an electronic system which incorporates the aforementioned electronic devices by using one or more Printed Circuit Boards (PCBs), each of which may include one or more microelectronic device packages(s). In some implementations, device package(s) may include one or more circuits having a rail-to-rail source follower as discussed above. Examples of device package(s) may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, device package(s) may include a memory circuit or device such as, for example, a Random Access Memory (RAM), a Static RAM (SRAM), a Magnetoresistive RAM (MRAM), a Nonvolatile RAM (NVRAM, such as flash memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, device package(s) may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, device package(s) may include one or more Micro-ElectroMechanical Systems (MEMS), Nano-ElectroMechanical Systems (NEMS), or the like. Generally speaking, device package(s) may be configured to be mounted onto PCB using any suitable packaging technology such as, for example, Ball Grid Array (BGA) packaging or the like. In some applications, the PCB may be mechanically mounted within or fastened onto electronic device. It should be noted that, in certain implementations, PCB may take a variety of forms and/or may include a plurality of other elements or components in addition to device package(s). It should also be noted that, in some embodiments, PCB may not be used and/or device package(s) may assume any other suitable form(s).

By now it should be appreciated that there has been provided an apparatus, method, and system for providing rail-to-rail capability to an output voltage terminal of a voltage follower feedback biased CMOS output circuit connected between first and second supply rail voltages $V_{DD}$, $V_{SS}$ to generate an output voltage at an output node in response to one or more input voltages or input currents. In selected embodiments, the voltage follower feedback biased CMOS output circuit includes a first NMOS transistor connected between the first supply rail voltage $V_{DD}$ and the output node with a first gate terminal coupled to a first control circuit input/output terminal and a second, diode-connected NMOS transistor and first current source connected in series between the first supply rail voltage $V_{DD}$ and a shared node, where a gate terminal of the second, diode-connected NMOS transistor is coupled to the first control circuit input/output terminal. In addition the voltage follower feedback biased CMOS output circuit includes a first PMOS transistor connected between the output node and the second supply rail voltage $V_{SS}$ with a second gate terminal coupled to the second control circuit input/output terminal, and a second, diode-connected PMOS transistor and second current source connected in series between the shared node and the second supply rail voltage $V_{SS}$, where a gate terminal of the second, diode-connected PMOS transistor is coupled to the second control circuit input/output terminal. In the disclosed source follower circuit, a control circuit is connected to the output node for automatically configuring the voltage follower feedback biased CMOS output circuit into an N-type, PN-type, or P-Type follower stage as a function of the output voltage. In some applications, the source follower circuit may not need to operate close to one of the supply rails, in which case the control circuit may be simplified by removing one side of the control circuit (e.g., N3-N7 and P8-P9) or the other (e.g., P3-P7 and N8-N9), as the case may be. To this end, the control circuit includes first and second bypass transistors connected in parallel between first and second control circuit input/output terminals and controlled, respectively, by a first control circuit input (e.g., in which a first bias voltage sets a first upper threshold voltage) and a second control circuit input (e.g., in which a second bias voltage sets a second lower threshold voltage). In selected embodiments, the bypass transistors include a PMOS bypass transistor connected between the first and second control circuit input/output terminals and having a gate terminal connected to receive the first control circuit input, and an NMOS bypass transistor connected between the first and second control circuit input/output terminals and having a gate terminal connected to receive the second control circuit input. The control circuit also includes first and second current generators for injecting source and sink currents in the output node as a function, respectively, of a first bypass current through the first bypass transistor which turns ON when the output voltage rises above a top threshold voltage level and of a second bypass current through the second bypass transistor which turns ON when the output voltage falls below a bottom threshold voltage level. In selected embodiments, the first current generator is connected between the first supply rail voltage $V_{DD}$ and the output node source, and the second current generator is connected between the output node and the second supply rail voltage $V_{SS}$. In other embodiments, the first current generator includes a source current mirror which generates a source current as a function of the first bypass current through the first bypass transistor, and the second current generator includes a sink current mirror which generates a sink current as a function of the second bypass current through the second bypass transistor. In some embodiments, the first and second current generators are each source-degenerated current mirrors and/or asymmetric current mirrors. In operation, the control circuit may be configured to turn off the first and second bypass transistors for midrange output voltage values to configure the voltage follower feedback biased CMOS output circuit as the PN-type follower stage. In addition, the control circuit may be configured to turn on the first bypass transistor for upper range output voltage values to configure the voltage follower feedback biased CMOS output circuit as the P-type follower stage. In addition, the control circuit may be configured to turn on the second bypass transistor for lower range output voltage values to configure the voltage follower feedback biased CMOS output circuit as the N-type follower stage.

In another form, there is provided an electronic device apparatus, method, and system for providing rail-to-rail capability to an output voltage terminal. In selected embodiments, the electronic device includes a rail-to-rail source follower circuit with a control circuit that is configured to receive first and second control circuit inputs and to generate an output voltage and output current at an output node between a source terminal of an N-type Metal-Oxide-Semiconductor (NMOS) transistor and a source terminal of a P-type Metal-Oxide-Semiconductor (PMOS) transistor. In selected embodiments, the NMOS transistor and PMOS transistor are connected to form a voltage follower feedback biased CMOS output circuit which includes the NMOS transistor connected between a first supply rail voltage $V_{DD}$ and the output node with a first gate terminal coupled to a first control circuit input/output terminal; a second, diode-connected NMOS transistor and first current source connected in series between the first supply rail voltage $V_{DD}$ and a shared node, where a gate terminal of the second, diode-connected NMOS transistor is coupled to the first control circuit input/output terminal; the PMOS transistor connected between the output node and a second supply rail voltage $V_{SS}$ with a second gate terminal coupled to a second control circuit input/output terminal; and a second, diode-connected PMOS transistor and second current source connected in series between the shared node and the second supply rail voltage $V_{SS}$, where a gate terminal of the second, diode-connected PMOS transistor is coupled to the second control circuit input/output terminal. With the first and second control circuit inputs configured to drive, respectively, first and second bypass transistors connected in parallel between a gate terminal of the NMOS transistor and a gate terminal of the PMOS transistor, the control circuit provides the output current as a sink current that is proportional to a drain current of the second bypass transistor and provides the output current as a source current that is proportional to a drain current of the first bypass transistor. In selected embodiments, the first bypass transistor is a PMOS bypass transistor connected between the first and second control circuit input/output terminals with a gate terminal connected to receive a first control circuit input, and the second bypass transistor is an NMOS bypass transistor connected between the first and second control circuit input output terminals with a gate terminal connected to receive a second control circuit input. In addition, the control circuit may include a first current generator that is connected between a first supply rail voltage $V_{DD}$ and the output node for injecting the source current in the output node, and may also include a second current generator that is connected between the output node and a second supply rail voltage $V_{SS}$ connected for injecting the sink current in the output node. In operation, the first bypass transistor turns ON when the output voltage rises above a top threshold voltage level and wherein the second bypass transistor turns ON when the output voltage falls below a bottom threshold voltage level. In this way, the control circuit may be configured (1) to turn on the first bypass transistor for upper range output voltage values to configure the rail-to-rail source follower circuit as a P-type follower stage, (2) to turn off the first and second bypass transistors for midrange output voltage values to configure the rail-to-rail source follower circuit as a PN-type follower stage, and (3) to turn on the second bypass transistor for lower range output voltage values to configure the rail-to-rail source follower circuit as an N-type follower stage.

In yet another form, there is provided a method and apparatus in which first and second control circuit inputs are received at a control circuit for a source follower circuit which includes an N-type Metal-Oxide-Semiconductor (NMOS) transistor and a P-type Metal-Oxide-Semiconductor (PMOS) transistor, wherein the first and second control circuit inputs are configured to drive, respectively, gate terminals of first and second bypass transistors connected in parallel between a gate terminal of the NMOS transistor and a gate terminal of the PMOS transistor, and wherein a source terminal of the NMOS transistor is coupled to a source terminal of the PMOS transistor at an output node to generate an output voltage and output current. In the disclosed method and apparatus, the control circuit determines a relative position of the output voltage in relation to a top threshold voltage level and a bottom threshold voltage level. In operation, when the output voltage rises above the top threshold voltage level, the control circuit injects a source current in the output node that is proportional to drain current in the first bypass transistor, such as by increasing the output current up to a maximum value by the control circuit to make the NMOS transistor non-conductive. And when the output voltage falls below the bottom threshold voltage level, the control circuit injects a sink current in the output node that is proportional to drain current in the second bypass transistor, such as by decreasing the output current down to a minimum value by the control circuit to make the PMOS transistor non-conductive.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. Such descriptions and representations are used by those skilled in the art to describe and convey the substance of their work to others skilled in the art. Although the described exemplary embodiments disclosed herein are directed to an exemplary rail-to-rail follower circuits, the present invention is not necessarily limited to the example embodiments illustrate herein, and various embodiments of the circuitry and methods disclosed herein may be implemented with other devices and software components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A source follower circuit, comprising:
   a voltage follower feedback biased CMOS output circuit connected between first and second supply rail voltages $V_{DD}$, $V_{SS}$ to generate an output voltage at an output node in response to one or more input voltages or input currents; and
   a control circuit connected to the output node for automatically configuring the voltage follower feedback biased CMOS output circuit into an N-type, PN-type, or P-Type follower stage as a function of the output voltage, the control circuit comprising:
   first and second bypass transistors connected in parallel between first and second control circuit input/output terminals and controlled, respectively, by first and second control circuit inputs; and
   first and second current generators for injecting source and sink currents in the output node as a function, respectively, of a first bypass current through the first bypass transistor which turns ON when the output voltage rises above a top threshold voltage level and of a second bypass current through the second bypass transistor which turns ON when the output voltage falls below a bottom threshold voltage level.

2. The source follower circuit of claim 1, where the voltage follower feedback biased CMOS output circuit comprises:

a first NMOS transistor connected between the first supply rail voltage $V_{DD}$ and the output node with a first gate terminal coupled to the first control circuit input/output terminal;

a second, diode-connected NMOS transistor and first current source connected in series between the first supply rail voltage $V_{DD}$ and a shared node, where a gate terminal of the second, diode-connected NMOS transistor is coupled to the first control circuit input/output terminal;

a first PMOS transistor connected between the output node and the second supply rail voltage $V_{SS}$ with a second gate terminal coupled to the second control circuit input/output terminal; and a second, diode-connected PMOS transistor and second current source connected in series between the shared node and the second supply rail voltage $V_{SS}$, where a gate terminal of the second, diode-connected PMOS transistor is coupled to the second control circuit input/output terminal.

3. The source follower circuit of claim 1, where the first and second bypass transistors comprise:

a PMOS bypass transistor connected between the first and second control circuit input/output terminals and having a gate terminal connected to receive the first control circuit input; and an NMOS bypass transistor connected between the first and second control circuit input/output terminals and having a gate terminal connected to receive the second control circuit input.

4. The source follower circuit of claim 3, where the first control circuit input comprises a first bias voltage that sets a first upper threshold voltage and where the second control circuit input comprises a second bias voltage that sets a second lower threshold voltage.

5. The source follower circuit of claim 1, where the first current generator is connected between the first supply rail voltage $V_{DD}$ and the output node source, and where the second current generator is connected between the output node and the second supply rail voltage $V_{SS}$.

6. The source follower circuit of claim 1, where the first current generator comprises a source current mirror which generates a source current as a function of the first bypass current through the first bypass transistor, and where the second current generator comprises a sink current mirror which generates a sink current as a function of the second bypass current through the second bypass transistor.

7. The source follower circuit of claim 6, where the first current generator comprises a first source-degenerated current mirror and where the second current generator comprises a second source-degenerated current mirror.

8. The source follower circuit of claim 1, where the control circuit is configured to turn off the first and second bypass transistors for midrange output voltage values to configure the voltage follower feedback biased CMOS output circuit as the PN-type follower stage.

9. The source follower circuit of claim 1, where the control circuit is configured to turn on the first bypass transistor for upper range output voltage values to configure the voltage follower feedback biased CMOS output circuit as the P-type follower stage.

10. The source follower circuit of claim 1, where the control circuit is configured to turn on the second bypass transistor for lower range output voltage values to configure the voltage follower feedback biased CMOS output circuit as the N-type follower stage.

11. An electronic device, comprising:

a rail-to-rail source follower circuit comprising a control circuit configured to receive first and second control circuit inputs and to generate an output voltage and output current at an output node between a source terminal of an N-type Metal-Oxide-Semiconductor (NMOS) transistor and a source terminal of a P-type Metal-Oxide-Semiconductor (PMOS) transistor, wherein the first and second control circuit inputs are configured to drive, respectively, first and second bypass transistors connected in parallel between a gate terminal of the NMOS transistor and a gate terminal of the PMOS transistor, wherein the control circuit provides the output current as a sink current that is proportional to a drain current of the second bypass transistor and provides the output current as a source current that is proportional to a drain current of the first bypass transistor, and wherein the first bypass transistor turns ON when the output voltage rises above a top threshold voltage level and wherein the second bypass transistor turns ON when the output voltage falls below a bottom threshold voltage level.

12. The electronic device of claim 11, wherein the NMOS transistor and PMOS transistor are connected to form a voltage follower feedback biased CMOS output circuit comprising:

the NMOS transistor connected between a first supply rail voltage $V_{DD}$ and the output node with a first gate terminal coupled to a first control circuit input/output terminal;

a second, diode-connected NMOS transistor and first current source connected in series between the first supply rail voltage $V_{DD}$ and a shared node, where a gate terminal of the second, diode-connected NMOS transistor is coupled to the first control circuit input/output terminal;

the PMOS transistor connected between the output node and a second supply rail voltage $V_{SS}$ with a second gate terminal coupled to a second control circuit input/output terminal; and a second, diode-connected PMOS transistor and second current source connected in series between the shared node and the second supply rail voltage $V_{SS}$, where a gate terminal of the second, diode-connected PMOS transistor is coupled to the second control circuit input/output terminal.

13. The electronic device of claim 12, where the first and second bypass transistors, respectively, comprise:

a PMOS bypass transistor connected between the first and second control circuit input/output terminals and having a gate terminal connected to receive a first control circuit input; and an NMOS bypass transistor connected between the first and second control circuit input/output terminals and having a gate terminal connected to receive a second control circuit input.

14. The electronic device of claim 11, where the control circuit comprises:

a first current generator connected between a first supply rail voltage $V_{DD}$ and the output node for injecting the source current in the output node; and a second current generator connected between the output node and a second supply rail voltage $V_{SS}$ connected for injecting the sink current in the output node.

15. The electronic device of claim 11, where the control circuit is configured to turn off the first and second bypass transistors for midrange output voltage values to configure the rail-to-rail source follower circuit as a PN-type follower stage.

16. The electronic device of claim 11, where the control circuit is configured to turn on the first bypass transistor for upper range output voltage values to configure the rail-to-rail source follower circuit as a P-type follower stage.

17. The electronic device of claim 11, where the control circuit is configured to turn on the second bypass transistor for lower range output voltage values to configure the rail-to-rail source follower circuit as an N-type follower stage.

18. A method comprising:
    receiving first and second control circuit inputs at a control circuit for a source follower circuit comprising an N-type Metal-Oxide-Semiconductor (NMOS) transistor and a P-type Metal-Oxide-Semiconductor (PMOS) transistor, wherein the first and second control circuit inputs are configured to drive, respectively, gate terminals of first and second bypass transistors connected in parallel between a gate terminal of the NMOS transistor and a gate terminal of the PMOS transistor, and wherein a source terminal of the NMOS transistor is coupled to a source terminal of the PMOS transistor at an output node to generate an output voltage and output current;
    determining, by the control circuit, a relative position of the output voltage in relation to a top threshold voltage level and a bottom threshold voltage level;
    injecting a source current in the output node that is proportional to drain current in the first bypass transistor when the output voltage rises above the top threshold voltage level; and
    injecting a sink current in the output node that is proportional to drain current in the second bypass transistor when the output voltage falls below the bottom threshold voltage level.

19. The method of claim 18, where injecting the source current comprises increasing the output current up to a maximum value by the control circuit to make the NMOS transistor non-conductive.

20. The method of claim 18, where injecting the sink current comprises decreasing the output current down to a minimum value by the control circuit to make the PMOS transistor non-conductive.

* * * * *